United States Patent [19]

Henry et al.

[11] Patent Number: 4,739,254

[45] Date of Patent: Apr. 19, 1988

[54] VOLTAGE MEASURING DEVICE OF A HIGH VOLTAGE METALCLAD INSTALLATION

[75] Inventors: Georges Henry, St. Martin-Le-Vinoux; Robert Girard, Meylan; Jean Kieffer, Crolles, all of France

[73] Assignee: Merlin Gerin, Grenoble Cedex, France

[21] Appl. No.: 916,569

[22] Filed: Oct. 8, 1986

[30] Foreign Application Priority Data

Oct. 14, 1985 [FR] France ............................ 85 15301

[51] Int. Cl.[4] ........................................ G01R 31/02
[52] U.S. Cl. ................................. 324/126; 174/11 R
[58] Field of Search ....................... 174/11 R, 11 BH; 324/126; 340/660, 661; 323/364, 370

[56] References Cited

U.S. PATENT DOCUMENTS

| | | | |
|---|---|---|---|
| 1,433,416 | 10/1922 | Reed | 174/11 R |
| 1,875,732 | 9/1932 | Holttum | 174/11 R |
| 3,652,777 | 3/1972 | Elliott | 174/11 R |
| 3,939,412 | 2/1976 | Hermstein et al. | 174/11 R |
| 3,974,440 | 8/1976 | Schiemann et al. | 323/364 |
| 4,052,668 | 10/1977 | Schmitt et al. | 324/126 |
| 4,320,337 | 3/1982 | Hartmann et al. | 324/126 |
| 4,591,783 | 5/1986 | Mastner | 324/126 |

FOREIGN PATENT DOCUMENTS

| | | |
|---|---|---|
| 2125297 | 11/1972 | Fed. Rep. of Germany ...... 323/364 |
| 3243342 | 3/1974 | Fed. Rep. of Germany . |
| 2313401 | 9/1984 | Fed. Rep. of Germany . |
| 0124214 | 9/1980 | Japan ................................ 174/11 R |
| 0025967 | 3/1930 | United Kingdom ........... 174/11 BA |

OTHER PUBLICATIONS

"Refillable Liquid Cooled Module", by Miller, IBM Tech. Disc. Bull., vol. 15, #7, 12/72, pp. 2301-2302.

*Primary Examiner*—Gerard R. Strecker
*Assistant Examiner*—W. Burns
*Attorney, Agent, or Firm*—Parkhurst & Oliff

[57] ABSTRACT

The low voltage capacitor of a capacitive divider of a metalclad substation is located in a sealed compartment separated from the substation enclosure. In normal operation, the compartment is in direct communication with the enclosure via a communication orifice. The compartment can be isolated from the enclosure by closing the communication orifice valve to drain this compartment and thus have access to the low voltage capacitor or to other components of the capacitive divider housed in this compartment. Any pressure or temperature difference between the compartment and the enclosure, liable to affect the measurement, is thus avoided, while authorizing access to the low voltage capacitor without having to drain the installation.

10 Claims, 2 Drawing Sheets

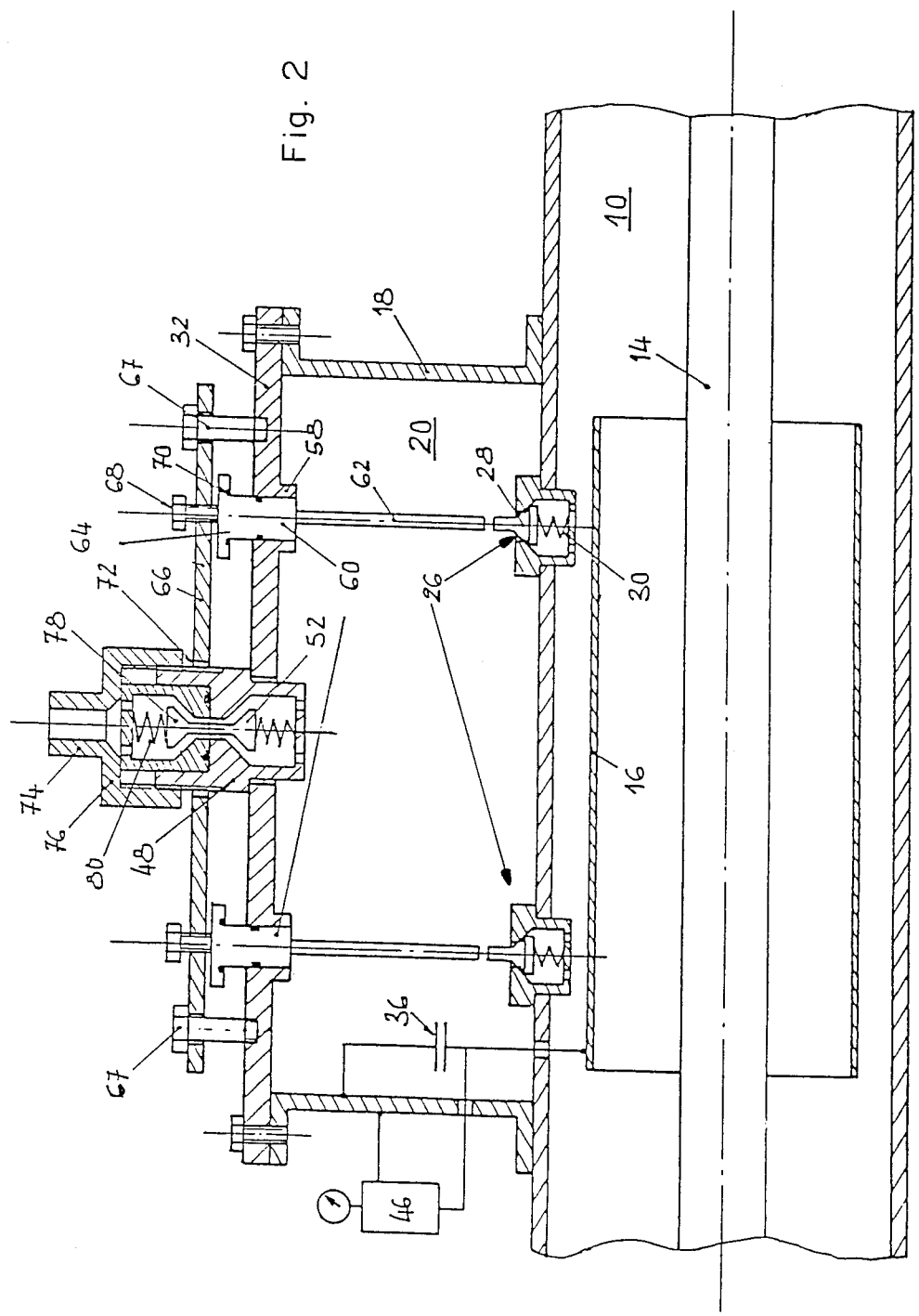

VOLTAGE MEASURING DEVICE OF A HIGH VOLTAGE METALCLAD INSTALLATION

BACKGROUND OF THE INVENTION

The invention relates to a voltage measuring device of a high voltage conductor, located in a sealed enclosure filled with a high dielectric strength gas, notably a high voltage metalclad installation, comprising a capacitive divider formed by a high voltage capacitor and a low voltage capacitor connected in series, the high voltage capacitor being located in said enclosure and comprising said conductor and an electrode surrounding said conductor and the low voltage capacitor being located outside said enclosure and being electrically connected to said electrode by a conductor passing through the enclosure wall.

A measuring device of the kind mentioned comprises a low voltage capacitor housed in the enclosure of the metalclad installation, more particularly in direct proximity to the high voltage capacitor. In this way inaccuracies due to temperature and pressure variations, which influence both the high voltage capacitor and the low voltage capacitor housed in the same enclosure, are avoided. The low voltage capacitor is a fragile element and servicing or repairs may be required periodically. In this case, the whole installation has to be taken out of the circuit and drained to give access to this low voltage capacitor. These draining operations, which subsequently require recreation of a vacuum and filling with sulphur hexafluoride, are delicate and complicated.

The object of the present invention is to provide a capacitive divider measuring device allowing easy access to the low voltage capacitor while avoiding variations due to the temperature or pressure of the gas in the installation.

SUMMARY OF THE INVENTION

The measuring device according to the present invention is characterized by the fact that the low voltage capacitor is located in a sealed compartment having a gas filling orifice and a communication orifice with said enclosure, said orifices being fitted with valves for said compartment to communicate selectively with the enclosure and a filling duct connected to the filling orifice.

In normal operation, the compartment housing the low voltage capacitor is in permanent communication with the enclosure containing the high voltage capacitor of the capacitive divider and any variation in pressure and/or temperature is automatically transmitted to the compartment, so as to avoid any influence on the measurement. Housing in a separate compartment enables the latter to be isolated from the installation enclosure by simply closing a valve associated with the communication orifice to enable operations to be carried out in this compartment. Subsequently, a vacuum is created in this compartment before re-establishing its communication with the enclosure, but this operation is limited and far simpler with the operation involving complete filling of the enclosure. The quantities of gas handled are notably smaller and the risks of leakage or pollution are considerably reduced.

Housing the low voltage capacitor in a separate compartment enables other parts of the measuring device to be fitted in this housing.

In order to avoid any operator error, the communication orifice valve is biased to the closed position, the opening control being actuated by fitting a cap sealing the filling orifice. Tight closing of the compartment is thus ensured before the latter is made to communicate with the metalclad installation enclosure. Removing the sealing cap on the other hand causes automatic closing of the communication orifice valve as does removing the compartment access cover. The communication orifice valve control advantageously comprises a sliding stem which cooperates with a push-rod passing tightly through the compartment cover. The sealing cap is arranged so that at the end of its sealing travel it engages the external part of the push-rod and moves the latter in the opening direction of the communication orifice valve. Fitting a filling duct on the coupler associated with the filling orifice does not actuate the above-mentioned push-rod so as to allow the compartment to be drained and filled, the latter remaining isolated from the enclosure. The filling orifice coupler advantageously comprises a stop valve biased to the closed position and moved to the open position by connection of the filling duct. This arrangement prevents any leakage during connection and disconnection and fitting operations of the filling orifice blanking device.

The low voltage capacitor may be of any kind with a capacity varying with the temperture in the same way as that of the high voltage capacitor.

BRIEF DESCRIPTION OF THE DRAWINGS

Other advantages and characteristics will become more clearly apparent from the following description of an embodiment of the invention, given as an example only, and represented in the accompanying drawings, in which:

FIG. 2 is a similar view to that of FIG. 1, showing the measuring device during the low voltage capacitor housing compartment draining phase.

DESCRIPTION OF THE PREFERRED EMBODIMENT

Figure 1:
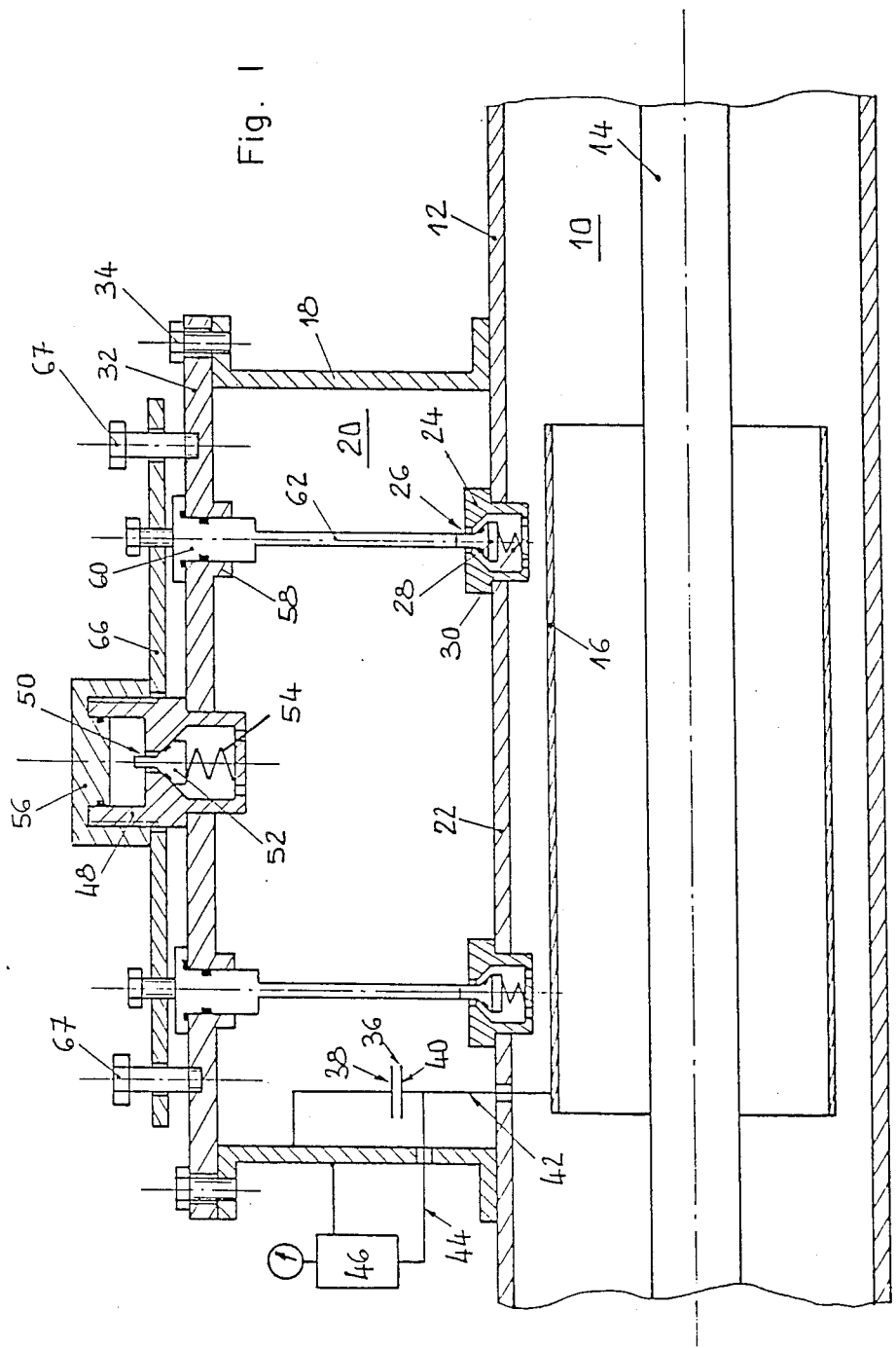
FIG. 1 is a schematic axial-section view of a measuring device according to the invention, shown in the normal operating positon.

In the figures, an enclosure 10 of a high voltage metalclad installation is filled with a high dielectric strength gas, for example sulphur hexafluoride (SF6) under pressure. In the example represented in the figures, the shell 12 of the enclosure 10 is cylindrical and coaxially surrounds a conductor 14, for example a bar under high voltage. Between the shell 12 and the bar 14 a cylindrical electrode 16 is fitted forming with the bar 14 a high voltage capacitor whose dielectric is the SF6. Outside the shell 12 an end-piece 18 is fixed enclosing a sealed compartment 20. In the wall 22 separating the compartment 20 from the enclosure 10, two couplers 24 are fitted each having a communication orifice 26, which can be closed by a valve 28, biased to the closed position by a spring 30. The end-piece 18 is closed on the opposite side from the wall 22 by a cover 32, held by securing screws 34 with interposed seals which are not shown in the figures. In the compartment 20 a low voltage capacitor 36 is housed, one electrode 38 of which is grounded, for example to the metal wall of the end-piece 18 and the other electrode 40 of which is connected on the one hand by a conductor 42 passing tightly through the wall 22 to the cylindrical electrode 16 of the high voltage capactor and on the other hand by a conductor 44 passing through the wall of the end-piece 18 to a measuring apparatus 46. It can easily be seen that connecting the high voltage capacitor 14, 16 and the low voltage capacitor 38, 40 in series constitutes a capacitive divider well known by those skilled in the art enabling the voltage of the conductor 14 to be measured. It is pointless giving a detailed description of such capacitive dividers, notably the measuring apparatus 46 which may be of any type.

The cover 32 supports a coupler 48 having a filling orifice 50, equipped with a valve 52, biased to the closed position by a spring 54. A sealing cap 56 providing double tightness and the operating mechanism of the valve 28 can be fitted on the coupler 48, for example by being screwed on, in the manner described below. Only the operating mechanism of one of the valves 28 is described, the other one being identical. The cover 32 has a guide sleeve 58 disposed facing the valve 28 of the communication orifice 26. In the sleeve 58 a tight sliding push-rod 60 is mounted having on its part internal to the compartment 20 a control stem 62 whose free end cooperates with the valve 28 of the communication orifice 26. The head 64 of the push-rod 60, located outside the compartment 20, cooperates with a plate 66, capable of movement, limited by a guide screw 67, in the sliding direction of the push-rod 60. An adjusting screw 68 is fitted between the head 64 of the push-rod 60 and the moving plate 66. In the position where the plate 66 is away from the cover 32, represented in FIG. 2, the push-rod 60 is in the raised position and the valve 28 is in the closed position of the communication orifice 26. In the position where the plate 66 is close to the cover 32, represented in FIG. 1, the depressed push-rod 60 actuates the valve 28 towards the open position of the communication orifice 26 by means of its stem 62. The head 64 has an O-ring 70 which is pressed down on the cover 32 when the push-rod 60 is in the depressed position to provide double sealing of the compartment 20. The moving plate 66 has an opening 72 through which the coupler 48 passes.

Referring now to FIG. 1, it can be seen that when the sealing cap 56 is fitted on the coupler 48, the edge of this cap 56 engages the moving plate 66 and pushes the latter to the position close to the cover 32 causing the communication valve 28 to open. Removal of the sealing cap 56 on the other hand allows the moving plate 66 to move away from the cover 32 due to the action of the return spring 30 of the valve 28 and allows the latter to close. After the sealing cap 56 has been removed, a connector 76 of a filling duct 74 can be fitted, for example by screwing or clipping onto the coupler 48. The connector 76 is equipped with a stop valve 78, biased to the closed position by a spring 80 and arranged to cooperate with the valve 52 to free the communication when the filling duct 74 is fitted. Such couplers with automatic closing on disconnection and inversely with automatic opening of the communication on connection are well known to those skilled in the art. The connector 76 is arranged in such a way as not to actuate the moving plate 66 during the connection operation in order to avoid any untimely opening of the valve 28 of the communication orifice 26.

The measuring device according to the invention operates in the following way:

In the normal operating position, the coupler 48 is covered by the sealing cap 56 pushing the moving plate 66 in the opening direction of the valves 28 of the communication orifices 26. In this position represented in FIG. 1, the compartment 20 communicates with the enclosure 10, the tightness of the compartment 20 in relation to the outside being ensured at the level of the coupler 48, both by the closed valve 52 and by the sealing cap 56. The depressed push-rods 60 also have double sealing limiting leakage risks. The communications provided by the orifices 26 prevent any pressure or temperature differences between the compartment 20 and the enclosure 10 and the measurement of the capacitive divider 14, 16 is not affected by such temperature or pressure variations, if a capacitor 36 is chosen varying with the temperature in the same way as the capacitor 14, 16.

When an incident occurs, for example failure of the low voltage capacitor 36, the sealing cap 56 is removed freeing the moving plate 66 which moves to the cleared position allowing the valves 28 of the communication orifices 26 to close. The filling duct 74 is then fitted as shown in FIG. 2. Connecting the filling duct 74 causes the valve 52 of the filling orifice 50 to open, the valves 28 of the communication orifices 26 remaining closed. The gas in the compartment 20 can be evacuated via the filling duct 74 being either recovered or rejected into the atmosphere. After the compartment 20 has been emptied, the cover 32 can be removed by unscrewing the screws 34 to give access to the capacitor 36. The enclosure 10 remains filled during this operation and the installation can remain live if required provided certain precautions are taken. When the repair operation has been carried out, the cover 32 simply has to be refitted and a vacuum created in the compartment 20 which is then filled with gas. When this operation has been completed, the filling duct 74 is disconnected with automatic closing of the valve 52 of the filling orifice 50. Fitting the sealing cap 56 causes the valves 28 of the communication orifices 26 to open again setting the installation to its original position, illustrated by FIG. 1.

Untimely removal of the cover 32, with the sealing cap 56 still fitted, also causes the valves 28 of the communication orifices 26 to close limiting the gas escaping from the enclosure 10.

It is clear that fitting a manual control of the valve 28 of the communication orifice 26 would not depart from the spirit of the invention, automatic control having the advantage of avoiding any operator error and stringent instructions. The filling duct can in this case be fixed permanently, any other kind of coupler also being able to be used.

What we claim is:

1. A voltage measuring device of a high voltage conductor of a metalclad installation, having a sealed enclosure filled with a high dielectric strength gas, a sealed compartment located outside said enclosure and a wall separating the compartment from the enclosure, said conductor being housed in said enclosure, said measuring device comprising a capacitive divider formed by a high voltage capacitor and a low voltage capacitor connected in series, the high voltage capacitor being housed in said enclosure and comprising said conductor and an electrode surrounding said conductor and the low voltage capacitor being located in said compartment and being electrically connected to said electrode by a conductor passing through said wall, said compartment having a gas filling orifice and a communication orifice with said enclosure, said orifices being fitted with valves for said compartment to communicate selectively with the enclosure and a filling duct connected to the filling orifice, and a control mechanism of the communication orifice valve being arranged so as to be actuated to open said communication orifice valve when a sealing cap is fitted on the filling orifice for closing said filling orifice.

2. A measuring device according to claim 1, comprising a cover of said compartment and a means of actuating said mechanism to close said communication orifice valve when the cover is removed.

3. A measuring device according to claim 1, comprising a cover of said compartment and a sliding stem passing tightly through said cover, part of said stem being located internal to said compartment and cooperating with the communication orifice valve and an external part of said stem being arranged so as to be moved automatically in an opening direction of the valve by a fitting movement of the sealing cap on the filling orifice.

4. A measuring device according to claim 3, wherein said stem provides as it passes through the cover a double sealing in the communication orifice valve.

5. A voltage measuring device of a high voltage conductor of a metalclad installation, having a sealed enclosure filled with a high dielectric strength gas, a sealed compartment located outside said enclosure and a wall separating the compartment from the enclosure, said conductor being housed in said enclosure, said measuring device comprising a capacitive divider formed by a high voltage capacitor and a low voltage capacitor connected in series, the high voltage capacitor being housed in said enclosure and comprising said conductor and an electrode surrounding said conductor and the low voltage capacitor being located in said compartment and being electrically connected to said electrode by a conductor passing through the said wall, said compartment having a communication orifice located in said wall separating the compartment from the enclosure, and a gas filling orifice, said orifices being fitted with valves for permitting said compartment to communicate selectively either with the enclosure or with a filling duct connected to the filling orifice, and a control mechanism of the communication orifice valve being arranged so as to be actuated to open said valve when a sealing cap is fitted on the filling orifice for closing said filling orifice.

6. A measuring device according to claim 5, wherein said compartment has a removable cover giving access to the low voltage capacitor when removed.

7. A measuring device according to claim 6, comprising means for actuating said control mechanism to close said communication orifice valve when the cover is removed.

8. A measuring device according to claim 5, wherein the filling orifice valve is actuated so as to be in an open position when a filling duct is connected on the filling orifice and is actuated so as to be in a closed position when said filling duct is disconnected from said filling orifice.

9. A measuring device according to claim 5, comprising a cover of said compartment and a sliding stem passing tightly through said cover, a first part of said stem internal to said compartment cooperating with the communication orifice valve and a second, external, part of said stem being arranged so as to be moved automatically in an opening direction of the valve when the sealing cap is fitted on the filling orifice.

10. A measuring device according to claim 9, wherein said stem provides a double sealing through the cover as it is in a position controlling the opening of the communication orifice valve.

* * * * *